United States Patent [19]

Hosono

[11] Patent Number: 5,093,572
[45] Date of Patent: Mar. 3, 1992

[54] SCANNING ELECTRON MICROSCOPE FOR OBSERVATION OF CROSS SECTION AND METHOD OF OBSERVING CROSS SECTION EMPLOYING THE SAME

[75] Inventor: Kunihiro Hosono, Hyogo, Japan

[73] Assignee: Mitsubishi Denki Kabushiki Kaisha, Tokyo, Japan

[21] Appl. No.: 601,140

[22] Filed: Oct. 23, 1990

[30] Foreign Application Priority Data

Nov. 2, 1989 [JP] Japan .................... 1-286929
Feb. 21, 1990 [JP] Japan .................... 2-40364
Aug. 13, 1990 [JP] Japan .................... 2-214840

[51] Int. Cl.$^5$ ............................ H01J 37/00
[52] U.S. Cl. ..................... 250/310; 250/306; 250/307; 250/309; 250/492.2; 250/492.1
[58] Field of Search ........... 250/310, 309, 307, 306, 250/492.2 R, 492.21, 492.3, 492.1

[56] References Cited

U.S. PATENT DOCUMENTS

| | | | |
|---|---|---|---|
| 3,434,894 | 3/1969 | Gale | 250/492.21 |
| 3,896,308 | 7/1975 | Venables et al. | 250/305 |
| 4,139,774 | 2/1979 | Katagiri | 250/492.2 |
| 4,151,420 | 4/1979 | Keller et al. | 250/492.21 |
| 4,219,731 | 8/1980 | Migitaka et al. | 250/397 |
| 4,451,738 | 5/1984 | Smith | 250/492.21 |
| 4,562,352 | 12/1985 | Shiokawa | 250/310 |
| 4,567,364 | 1/1986 | Smith et al. | 250/397 |
| 4,939,364 | 7/1990 | Ishitani et al. | 250/492.2 |

OTHER PUBLICATIONS

Sudraud et al., "Focused Ion-Beam Milling of a Submicrometer Aperture for a Hydrodynamic Josephson-Effect Experiment", J. Appl. Phys. 62(6), Sep. 15, 1987, pp. 2163-2168.

Sudraud et al., "Focused-Ion -Beam Milling, Scanning-Electron Microscopy, and Focused-Droplet Deposition in a Single Microcircuit Surgery Tool", J. Vac. Sci. Technol. B6(1), Jan.-Feb. '88, pp. 234-238.

Primary Examiner—Jack I. Berman
Assistant Examiner—Kiet T. Nguyen
Attorney, Agent, or Firm—Lowe, Price, LeBlanc & Becker

[57] ABSTRACT

Disclosed are a scanning electron microscope for cross section observation capable of cutting more accurately a cross section of a specific portion of semiconductor wafer in a shorter time, and a cross section observing method employing such a microscope. The scanning electron microscope includes an SEM column 100, an FIB column 200 mounted together with SEM column 100, and a reflected-electron detector 21 for detecting electrons to be reflected from the semiconductor wafer by scanning with an electron beam 30 from the SEM. Thus, since a process of cutting a cross section to be observed by scanning with an ion beam 31 from FIB column 200 can be observed in real time by employing the reflected electrons of electron beam 30 from SEM column 100, a specific portion of the cross section can be cut more accurately in a shorter time.

16 Claims, 7 Drawing Sheets

SCANNING ELECTRON MICROSCOPE FOR OBSERVATION OF CROSS SECTION AND METHOD OF OBSERVING CROSS SECTION EMPLOYING THE SAME

BACKGROUND OF THE INVENTION

1. Field of the Invention

The present invention relates generally to scanning electron microscopes for observation of cross sections and methods of observing cross sections employing the scanning electron microscopes and, more particularly, to a scanning electron microscope to be employed for observing a cross section of semiconductor wafer by directing an electron beam to the cross section thereof and to a cross section observing method employing such a scanning electron microscope.

2. Description of the Background Art

For failure analysis and process evaluation of semiconductor integrated circuits, a scanning electron microscope (hereinafter referred to as SEM) has conventionally been known as a device to be employed for observation of a surface and a cross section. In a cross section observing method employing the SEM (Scanning Electron Microscope), the method has been adopted in which wafer is cut so that a desired cross section of wafer can be observed.

FIG. 7 is a perspective view of semiconductor wafer which is required when a cross section observing method employing a conventional SEM is adopted. The cross section observing method employing the conventional SEM 5 will be described with reference to FIG. 7. A plurality of chips are formed on semiconductor wafer 27. First, a test chip 28 for cross section observation is selected to carry out cross section observation. Semiconductor wafer 27 is then cut so that the cross section 129 of test chip 28 to be observed may appear. In this manner, the cross section 129 of test chip 28 to be observed is observed by employing the SEM after exposed. As described above, conventionally, semiconductor wafer 27 has been cut manually so as to expose cross section 129 of test chip 28.

As aforementioned, in the method of observing the cross section of the semiconductor wafer employing the conventional SEM, semiconductor wafer 27 is manually cut so as to expose cross section 129 of test chip 28 in cross section observation. In the method of cutting semiconductor wafer 27, it is extremely difficult to accurately expose a specific portion of the cross section since potions corresponding to cross section 129 to be observed are cut manually. This method has another disadvantage of requiring a long time for fabrication of samples and for observation of the cross section. Since the semiconductor wafer is cut in order to carry out the cross section observation, the cut wafer cannot be subjected to a subsequent wafer process. 5 Thus, a further disadvantage has been provided that wafer for cross section observation must be prepared for each wafer process. That is, in the cross section observing method employing the conventional SEM, since the wafer is cut manually, a specific portion of the cross section cannot be accurately exposed, and the observation of the cross section requires a long time. Moreover, a wafer for observation of the cross section is required for each wafer process.

Thus, as an improvement of the cross section observing method employing the convention SEM, such a cross section observing method has conventionally been proposed that employs a scanning electron microscope for cross section observation which includes an FIB (Focused-Ion-Beam) column combined with an SEM column. This is disclosed in J. Appl. Phys. 62(6), Sept. 15, 1987, pp. 2163-2168. FIG. 8 is a schematic diagram showing the configuration of the proposed scanning electron microscope for cross section observation. Referring to FIG. 8, the scanning electron microscope includes an SEM column 100 for directing an electron beam 30 to a sample 27 to scan the sample, an FIB column 200 for generating an ion beam 31 to scan sample 27, a photomultiplier 23 for detecting secondary electrons emitted from sample 27 by scanning with electron beam 30 and ion beam 31, and an observation CRT 26 connected to photomultiplier 23. In a cross section observing method employing this scanning electron microscope, electron beam 30 and ion beam 31 are first made in registration with each other at a reference mark. Then, a place to be processed is observed with electron beam 30 and then processed with ion beam 31. The employment of this scanning electron microscope for cross section observation has an advantage that it is unnecessary to manually cut sample 27 (semiconductor wafer) for observation of the cross section.

However, the proposed scanning electron microscope fails to perform observation by SEM simultaneously with a process by FIB because the SEM-observation is carried out by employing the secondary electrons generated from the semiconductor wafer (sample 27). More specifically, since the secondary electrons are generated from the semiconductor wafer (sample 27) in both FIB-scanning and SEM-scanning of the semiconductor wafer, it is impossible to detect only the secondary electrons by the SEM-scanning even though the cross section observation is carried out by SEM at the same time when cutting the cross section of the semiconductor wafer (sample 27) with FIB. FIGS. 9A-9E are schematic diagrams for explaining a process for cutting a cross section to be observed by the proposed scanning electron microscope. Referring to FIGS. 9A-9E, in the proposed scanning electron microscope, it is necessary, when cutting the cross section to be observed, to repeat the step of cutting a predetermined amount of the cross section with FIB as shown in FIG. 9A, and then observing the cross section by SEM as shown in FIG. 9B (FIGS. 9A-9E). Accordingly, there is a disadvantage that it is difficult to reduce the time required to cut the cross section to be observed. That is, the intervals between the processes by FIB shown in FIGS. 9A and 9C and the observations by SEM shown in FIGS. 9B and 9D require approximately several seconds in general, so that a continuous observation cannot be carried out. As one countermeasures, such an approach is considered that reduces the intervals by multiplexing a control system of FIB and SEM; however, this approach results in a disadvantage of complexity of the apparatus. In addition, since the cutting of the cross section to be observed with FIB cannot be carried out simultaneously with the observation by SEM, it is difficult to obtain more accurately a specific portion of the cross section to be observed.

SUMMARY OF THE INVENTION

One object of the present invention is to cut more accurately a specific portion of a cross section of semiconductor wafer to be observed in a scanning electron microscope for cross section observation.

Another object of the present invention is to cut a specific portion of a cross section of semiconductor wafer to be observed in a shorter time in a scanning electron microscope for cross section observation.

A further object of the present invention is to reduce the time required for a cross section observing process in a cross section observing method employing a scanning electron microscope for cross section observation.

Briefly, according to a first aspect of the present invention, a scanning electron microscope for cross section observation includes an ion beam scanning device for scanning semiconductor wafer with an ion beam to cut a cross section of the wafer, an electron beam scanning device for scanning with an electron beam the cross section of the semiconductor wafer cut by the ion beam scanning device, an electron detecting device for detecting secondary electrons to be generated from the semiconductor wafer by the scanning with the ion beam and electron beam and detecting electrons to be reflected from the semiconductor wafer by the scanning with the electron beam, and a scan region observing 5 device for observing the state of a cross section in a region scanned by the electron beam scanning device based on the result of the detection by the electron detecting device.

In operation, the electron beam scanning device scans with the electron beam the cross section of the semiconductor wafer cut by the ion-beam scanning by the ion beam scanning device. The electron detecting device detects the electrons reflected from the semiconductor wafer by the electron-beam scanning, so that a cross section observation is carried out utilizing the reflected electrons while cutting the cross section to be observed.

According to a second aspect of the present invention, a cross section observing method employing the scanning electron microscope for cross section observation includes the steps of: moving a sample plate having semiconductor wafer thereon to and near a region employed for cross section observation; after moving the sample plate, scanning the region and the vicinity thereof for the cross section observation with an ion beam to generate secondary electrons from the semiconductor wafer and detect the generated secondary electrons, so as to set a position for carrying out the cross section observation; scanning the set position with the ion beam to cut a cross section; scanning the cross section with an electron beam when cutting the cross section, to detect electrons reflected from the semiconductor wafer and observe a cutting process of the cross section; and scanning with the electron beam the cross section cut by the step of cutting the cross section, to generate the secondary electrons from the semiconductor wafer and detect the generated secondary electrons, so as to observe the state of the cross section scanned with the electron beam.

In operation, the sample plate on which the semiconductor wafer is placed is moved to and around the region for the cross section observation. Thereafter, the position where the cross section observation is to be carried out is scanned with the ion beam, to cut the cross section. The cut cross section is scanned with the electron beam, so that the reflected electrons from the semiconductor wafer are detected, resulting in observation of the cross section cutting process. Accordingly, the cross section observation is carried out simultaneously with the process of the cross section to be observed.

The foregoing and other objects, features, aspects and advantages of the present invention will become more apparent from the following detailed description of the 5 present invention when taken in conjunction with the accompanying drawings.

DESCRIPTION OF THE PREFERRED EMBODIMENTS

Figure 1:
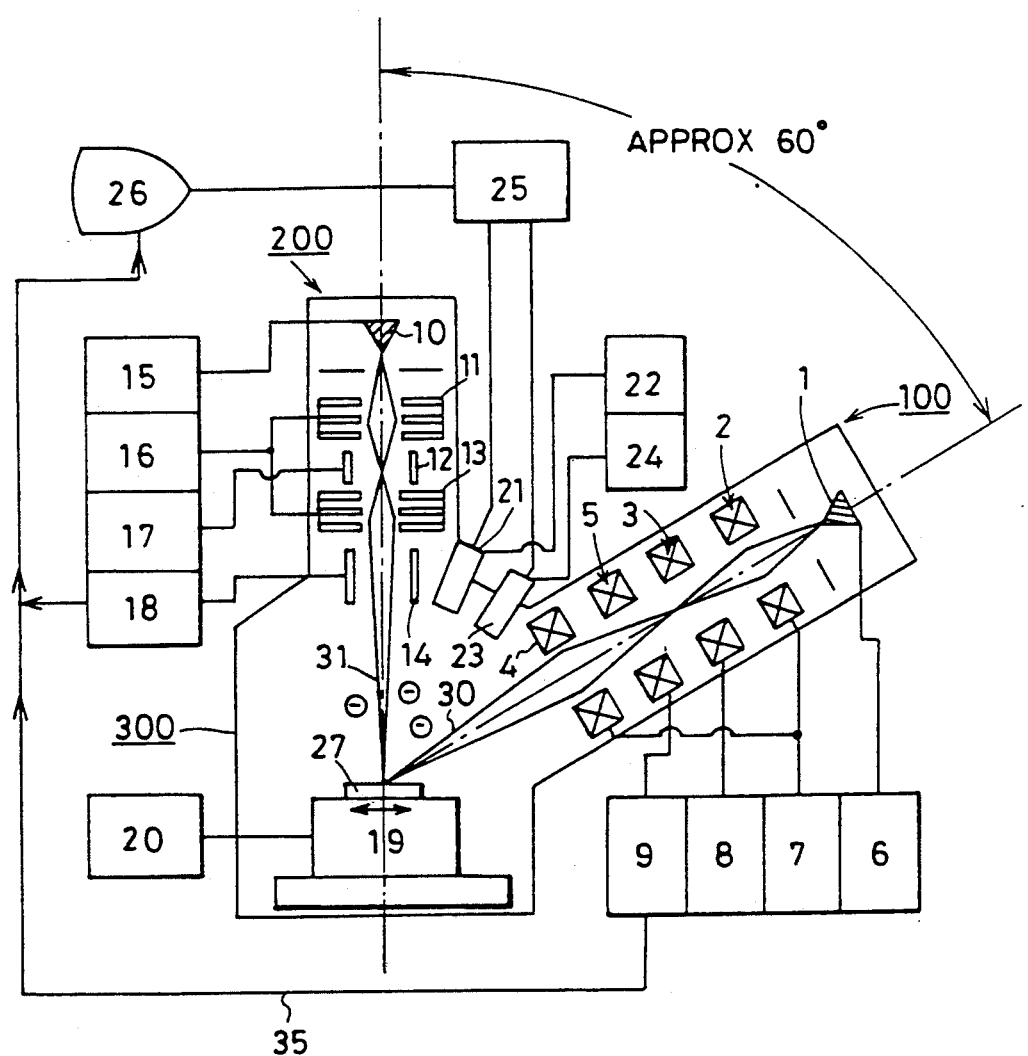
FIG. 1 is a schematic diagram of a scanning electron microscope for cross section observation showing one embodiment of the present invention.

Referring to FIG. 1, a scanning electron microscope for cross section observation comprises an SEM column 100, an FIB column 200 and a sample chamber 300.

SEM column 100 includes an electron gun 1 for generating an electron beam, an SEM first lens 2 for focusing an electron beam 30 generated from electron gun 1, an SEM blanking coil 3 for turning on and off the electron beam focused by SEM first lens 2, an SEM deflecting coil 5 for scanning electron beam 30 that has passed through SEM blanking coil 3, and an SEM second lens 4 for converging electron beam 30 again that has passed through SEM deflecting coil 5. Electron gun 1, SEM first lens 2 and SEM second lens 4, SEM blanking coil 3, and SEM deflecting coil 5 are connected with a power source 6 for driving the electron gun, an SEM lens power source 7, an SEM blanking power source 8 and an SEM deflecting power source 9, respectively.

FIB column 200 comprises a liquid metal ion source 10 for generating an ion beam, an FIB first lens 11 for focusing an ion beam 31 generated from liquid metal ion source 10, an FIB blanking electrode 12 for turning on 5 and off ion beam 31 focused by FIB first lens 11, an FIB second lens 13 for focusing again ion beam 31 that has passed through FIB blanking electrode 12, and an FIB deflecting electrode 14 for deflecting ion beam 31 focused by FIB second lens 13. Liquid metal ion source 10, FIB first lens 11 and FIB second lens 13, FIB blanking electrode 12, and FIB deflecting electrode 14 are connected with a power source 15 for driving the ion source, an FIB lens power source 16, an FIB blanking power source 17 and an FIB deflecting power source 18, respectively.

Sample chamber 300 includes a sample plate 19 for placing semiconductor wafer 27 thereon, a sample plate driving apparatus 20 for moving sample plate 19, a reflected-electron detector 21 for detecting electrons of electron beam 30 reflected by semiconductor wafer 27, and a secondary electron detector 23 for detecting secondary electrons to be generated from semiconductor wafer 27 by the scanning with electron beam 30 and ion beam 31. Reflected-electron detector 21 and secondary electron detector 23 are connected with a power source 22 for controlling the reflected-electron detector and a power source 24 for controlling the secondary electron detector, respectively. A detection signal amplifier 25 is connected to reflected-electron detector 21 and secondary electron detector 23, and an observation CRT 26 is connected to detection signal amplifier 25.

Observation CRT 26 is connected with SEM deflecting power source 9 and FIB deflecting power source 18. SEM column 100 is mounted at approximately 60° angle of incidence with respect to sample plate 19 so that a cross section of a sample can be observed. FIB column 200 is mounted approximately vertical to sample plate 19. An acceleration voltage of SEM column 100 is set for 1 KV or more. Reflected-electron detector 21 and secondary electron detector 23 are controlled by the power source 22 for controlling the reflected-electron detector and power source 24 for controlling the secondary electron detector, respectively. More specifically, signals detected by reflected-electron detector 21 and secondary electron detector 23 are amplified by detection signal amplifier 25 and then projected on observation CRT 26 in synchronization with a scan synchronizing signal 35. Reflected-electron detector 21 is supplied with a bias voltage to prevent detection of secondary electrons generated upon scanning with electron beam 30 and ion beam 31.

Figure 2:
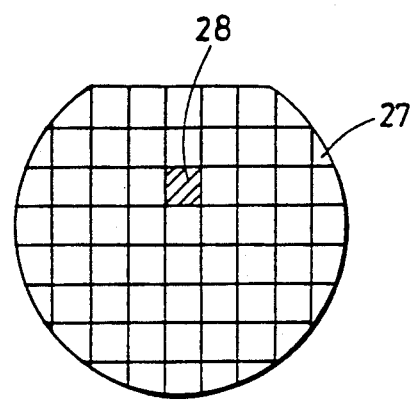
FIG. 2 is a plan view of semiconductor wafer employed in a cross section observing method employing the scanning electron microscope shown in FIG. 1.
Figure 3:
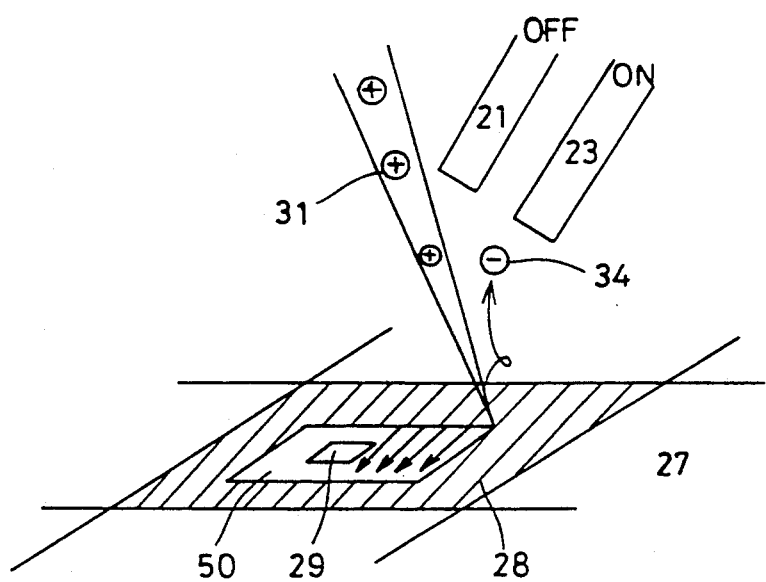
FIGS. 3-5 are observation process diagrams for explaining the cross section observing method employing the scanning electron microscope shown in FIG. 1.

Referring to FIG. 2, semiconductor wafer 27 is formed of a plurality of chips, from which a test chip 28 for cross section observation is selected in advance.

A cross section observing method will now be described with reference to FIGS. 1-5. A description will first be given on a process of setting an ion-beam scan area for cutting a cross section by scanning with ion beam 31, with reference to FIG. 3. Sample plate driving apparatus 20 (see FIG. 1) moves sample plate 19 (see FIG. 1) to and around a cutting region 50 in which a cross section observation is automatically or manually carried out. Cutting region 50 or thereabout is scanned with ion beam 31, to detect secondary electrons 34 generated from semiconductor wafer 27 and display an image thereof on observation CRT 26. Based on the display on observation CRT 26, an input device such as a keyboard, a mouse or the like designates a position of an ion beam scan region 29 for cutting. Only secondary electron detector 23 operates as a detector in this case.

A description will now be given on a process of cutting a cross section to be observed by employing a sputter-etching function by scanning with ion beam 31, with reference to FIG. 4. First, ion beam scan region 29 is scanned with ion beam, to start cutting the cross section. At the same time, reflected-electron detector 21 detects reflected electrons 32 on the cross section to be cut by scanning with electron beam 30. A detection signal of reflected-electron detector 21 is amplified by the detection signal amplifier and then displayed on observation CRT 26. This enables monitoring of the cutting process with ion beam 31. In this case, only reflected-electron detector 21 is rendered operative, whereas secondary electron detector 23 is rendered inoperative. In the above-described manner, the cutting process is monitored in real time, and when a required cross section is obtained, the ion-beam scanning is immediately stopped. This makes it possible to obtain more accurately a specific portion of a super micro region of the cross section than in the conventionally proposed improvement. Moreover, this makes it possible to cut the cross section to be observed in a shorter time and to achieve a faster process of the cross section observation compared with the conventional improvement.

Figure 5:
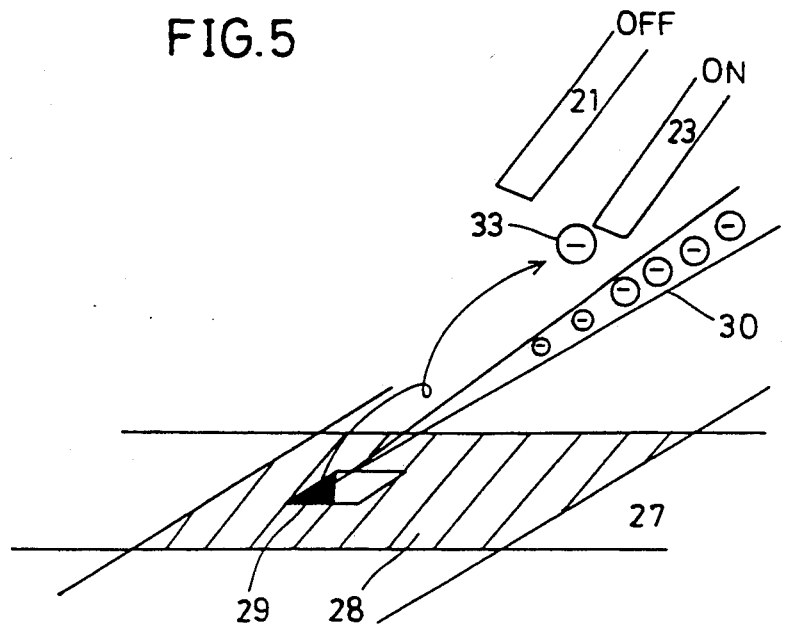

A description will then be given on a process of observing the cross section cut by the scanning with ion beam 31, with reference to FIG. 5. The cross section cut by the scanning with ion beam 31 is scanned only with electron beam 30. Secondary electron detector 23 detects secondary electrons 33 generated from semiconductor wafer 27 by the scanning with electron beam 30. A detection signal of secondary electron detector 23 is amplified by detection signal amplifier 25 and then displayed on observation CRT 26. This secondary electron observation enables a highly precise observation of the cross section. As described above, in this embodiment, it is possible to cut arbitrary cross section in considerably high precision and immediately perform the observation of the cross section, thereby enabling an efficient observation of the cross section of a micro region. In addition, since this embodiment is also applicable to a cross section observation of micro foreign matters which are mixed in during a certain process, it is also effective to control cleanliness of a wafer process.

Figure 6:
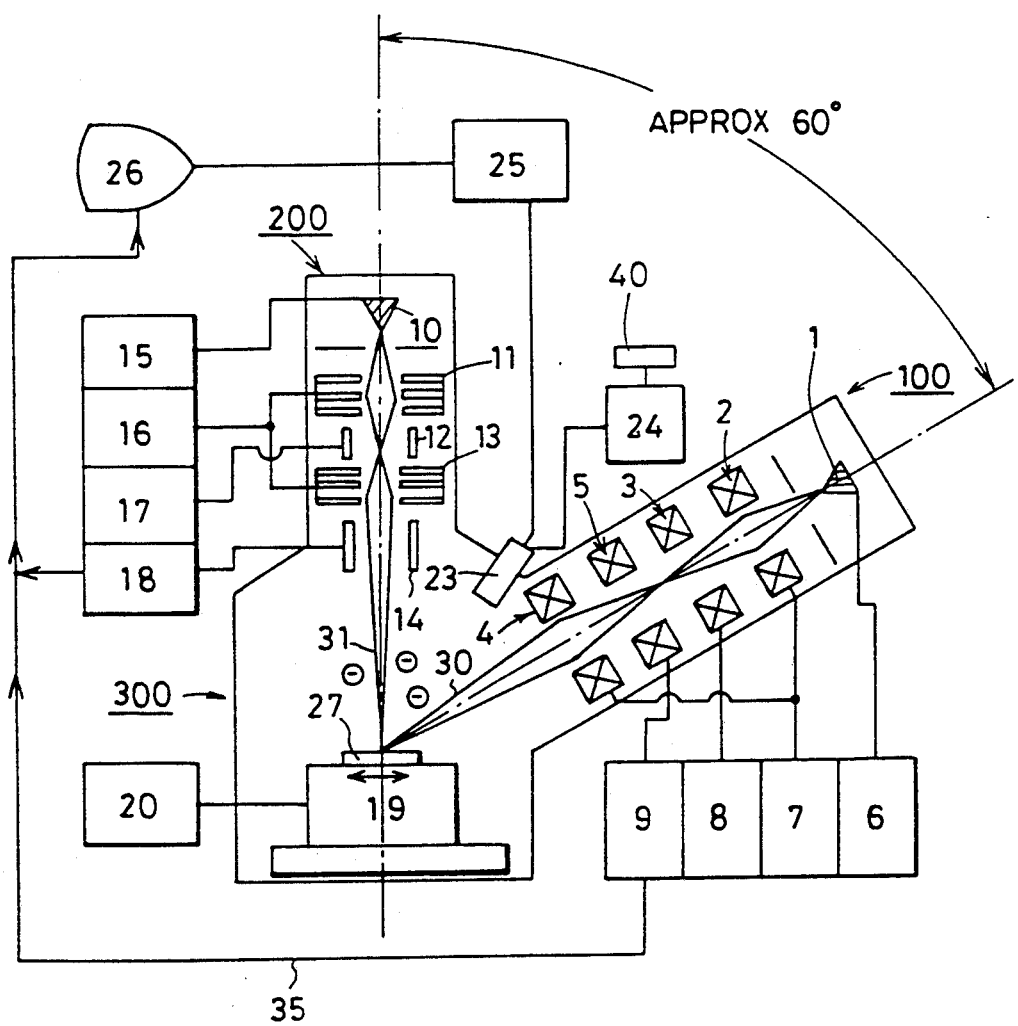
FIG. 6 is a schematic diagram of a scanning electron microscope for cross section observation when a common electron detector is employed that serves both as a reflected-electron detector and as a secondary electron detector according to another embodiment of the present invention.
Figure 7:
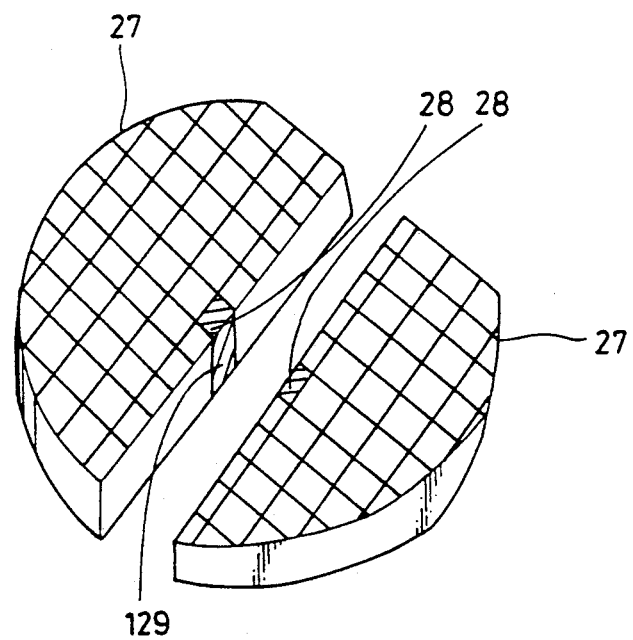
FIG. 7 is a perspective view of semiconductor wafer employed in the cross section observing method employing the conventional scanning electron microscope.
Figure 8:
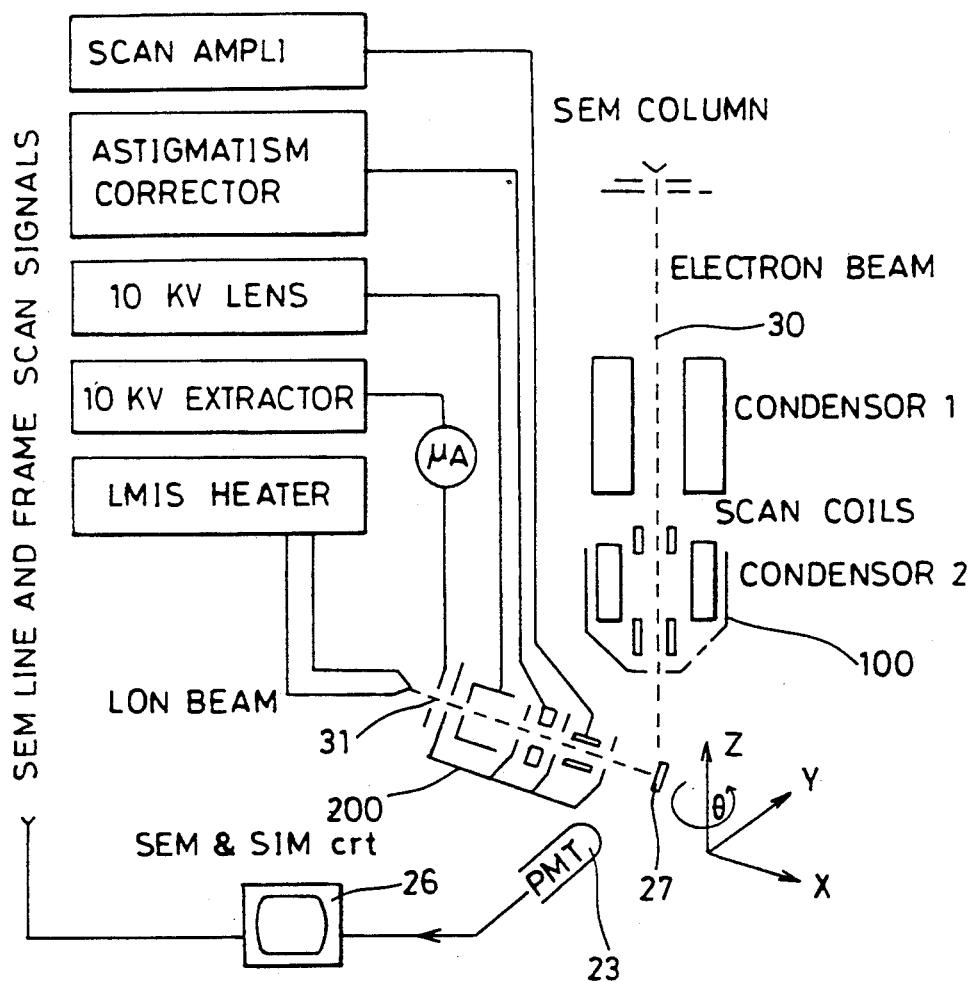
FIG. 8 is a schematic diagram showing the configuration of the conventionally proposed scanning electron microscope for cross section observation.
Figure 9A:
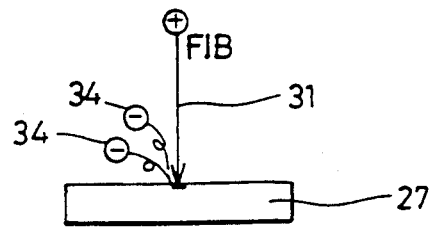
FIGS. 9A-9E are schematic diagrams for explaining a process for cutting a cross section to be observed by the conventionally proposed scanning electron microscope.
Figure 9B:
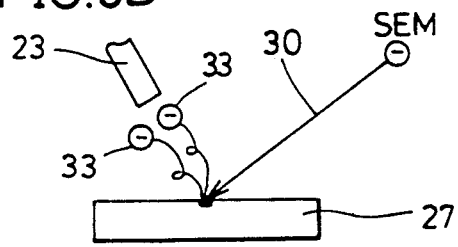
Figure 9C:
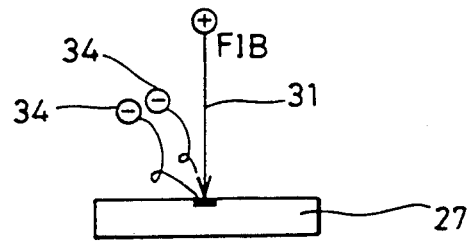
Figure 9D:
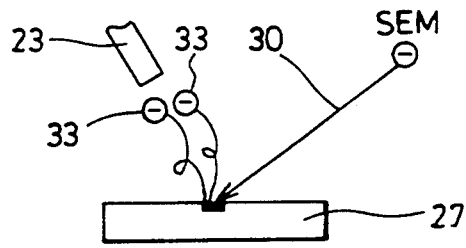
Figure 9E:
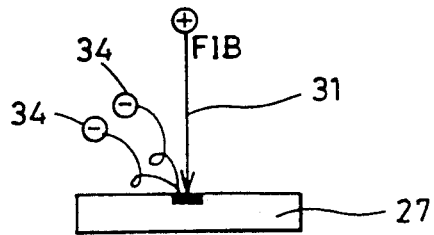

As reflected-electron detector 21 and secondary electron detector 23, a scintillator, a photomultiplier and the like are employed. While reflected-electron detector 21 and secondary electron detector 23 are provided independently in this embodiment, the same detector may be employed. Referring to FIG. 6, secondary electron detector 23 is employed also as a reflected-electron detector. That is, when the same detector is employed as reflected-electron detector 21 and secondary electron detector 23, the foregoing effect is obtained by changing a bias voltage by a change-over switch 40. More specifically, secondary electrons are in general several tens to several hundreds eV, whereas reflected electrons have energy close to that of incident electron beam 30, e.g., for the SEM of 10 KeV, the reflected electrons are ~10 KeV, and for the SEM of 1 KeV, they are ~1 KeV. Accordingly, if the bias voltage of the detector is reverse-biased to slightly lower than 1 KeV, only the reflected electrons can be detected. This makes it possible to monitor only the image of the reflected electrons caused by electron beam 30. While secondary electron detector 23 is mounted so as to be able to detect both secondary electrons 33 generated from electron beam 30 and secondary electrons 34 generated from ion beam 31 in this embodiment, a plurality of second electron detectors may be mounted at appropriate positions for optimization when asymmetry of the brightness of a secondary electron image becomes a problem due to a position where the secondary electron is irradiated. In addition, while the same ion beam is employed for the cutting of the cross section and for the setting of the scan region in this embodiment, the present invention is not limited to this. When the ion-beam scanning causes a problem that the surface of the sample is damaged by irradiation of ion beam, the damage caused by the ion beam irradiation may be reduced by decreasing the amount of the ion beam to be irradiated to a required minimum amount such as by a decrease in ion beam current and an acceptance of secondary electrons into an image memory. Moreover, while physical sputtering of sample constituting atoms by the direct etching of the ion beam is employed in this embodiment, the present invention is not limited to this. A reactive gas may be introduced through a nozzle, so as to cut a cross section by employing an assisted-etching function by a chemical reaction. Furthermore, while a process evaluation is carried out by monitoring the whole process with test chip 28 for observation of the cross section of one chip being provided in wafer 27 in this embodiment, the present invention is not limited to this and may be employed in failure analysis of semiconductor elements.

As has been mentioned above, in the scanning electron microscope for cross section observation shown in FIG. 1, FIB column 200 is combined together with SEM column 100, and reflected-electron detector 21 is newly provided in addition to secondary electron detector 23, so that when the cross section to be observed is cut with ion beam 31, the cross section observation can be performed in real time by scanning with electron beam 30 and then detecting reflected electrons thereof. This makes it possible to cut more accurately a specific portion of the cross section of arbitrary chip in the wafer in a shorter time to observe the cut cross section.

Figure 4:
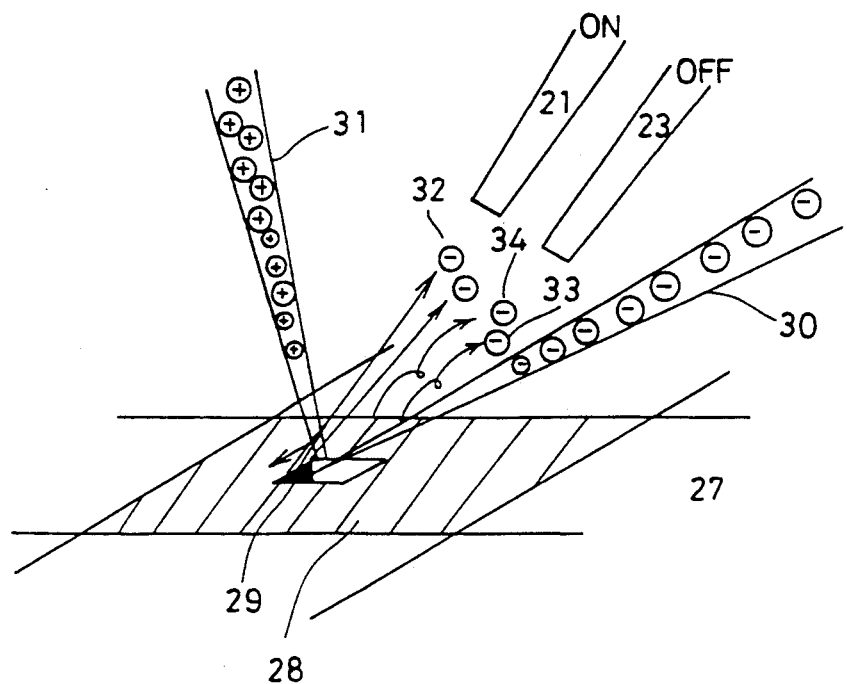

In the cross section observing method employing the scanning electron microscope shown in FIG. 4, the cutting of the cross section starts with scanning with ion beam 31 and, at the same time, reflected-electron detector 21 detects reflected electrons 30 of the cross section being out by scanning with electron beam 30, so that the cutting process of the cross section to be observed by ion beam 31 can be observed in real time. This makes it possible to immediately stop the ion-beam scanning when a required cross section is obtained and to process more accurately the cross section to be observed. Furthermore, a faster process of cross section observation can be accomplished, resulting in a decrease in observation time.

As has been described heretofore, in the scanning electron microscope for cross section observation according to the present invention, the ion beam scanning device scans with the ion beam the position where the observation of the cross section of the semiconductor wafer is to be performed, to cut the cross section. The electron beam scanning device scans with the electron beam the cross section to be cut, to detect 5 the electrons reflected from the semiconductor wafer by the electron detecting device. Thus, the cross section observation is carried out by utilizing the reflected electrons while cutting the cross section to be observed. This makes it possible to more accurately cut the cross section of the specific portion of the semiconductor wafer in a shorter time to observe the cut cross section.

In the cross section observing method employing the scanning electron microscope for cross section observation according to the present invention, after the sample plate on which the semiconductor wafer is placed is moved to and around the region where the cross section observation is carried out, the ion beam is scanned at the position where the cross section observation is carried out, to cut the cross section. Then, the electron beam is scanned at the cross section being cut, to detect the electrons reflected from the semiconductor wafer and then detect the cross section cutting process. Thus, the cross section observation is carried out while processing the cross section to be observed. This makes it possible to more accurately cut the section to be observed in a shorter time to perform the observation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. Apparatus for observing cross-section during cutting into the surface of a semiconductor wafer, comprising:
   ion beam scanning means for scanning said semiconductor wafer with an ion beam to cut a cross section, said ion beam scanning means mounted so that a scanning direction of the ion beam may be approximately vertical to a main surface of said semiconductor wafer;
   electron beam scanning means for scanning with said electron beam the cross section of said semiconductor wafer cut by said ion beam scanning means; said electron beam scanning means being angularly displaced from said ion beam scanning means by a predetermined angle so that the cross section of said semiconductor wafer to be cut can be scanned with said electron beam;
   electron detecting means for detecting secondary electrons to be generated from said semiconductor wafer by the scanning with said ion beam and said electron beam and detecting electrons to be reflected from said semiconductor wafer by the scanning with said electron beam; and
   scan region observing means for observing the state of the cross section in a region to be scanned by said electron beam scanning means in response to a result of the detection by said electron detecting means.

2. The apparatus according to claim 1, wherein said electron detecting means includes secondary electron detecting means and separate reflected-electron detecting means.

3. The apparatus according to claim 1, wherein said electron detecting means includes a switch for switching between detecting said reflected electrons and detecting said secondary electrons.

4. The apparatus according to claim 1, wherein said scan region observing means is responsive to a scan synchronizing signal from said ion beam scanning means or said electron beam scanning means.

5. The apparatus according to claim 1, wherein said predetermined angle is approximately 60°.

6. A cross section cutting and observing method employing a scanning electron microscope for cross section observation for directing an electron beam to a cross section of a semiconductor wafer to observe a state of the cross section of said semiconductor wafer, said method comprising the steps of:
   moving a sample plate having said semiconductor wafer placed thereon to and around a region where the cross section observation is to be carried out;
   after moving said sample plate, scanning an ion beam at and around said region where said cross section observation is carried out to generate secondary electrons from said semiconductor wafer, and detecting said generated secondary electrons to set a position where said cross section observation is to be carried out;

scanning with an ion beam said set position where said cross section observation is to be carried out, to cut a cross section;

when cutting said cross section, scanning with said electron beam said cross section to be cut and detecting electrons to be reflected from said semiconductor wafer, to observe a process of cutting said cross section; and scanning with said electron beam the cross section cut by said cross section cutting step to generate secondary electrons from said semiconductor wafer, and detecting said secondary electrons to observe the state of the cross section scanned with said electron beam.

7. The cross section cutting and observing method according to claim 6, wherein said step of detecting said reflected electrons includes the step of detecting the reflected electrons by changing a bias voltage of a detecting means for detecting said secondary electrons.

8. The cross section cutting and observing method according to claim 6, wherein said cross section observing position setting step, said cross section cutting process observing step and said cross section state observing step each includes the step of making an observation in synchronization with a scan signal of said ion beam or said electron beam.

9. The cross section cutting and observing method according to claim 6, wherein said cross section observing position setting step, said cross section cutting process observing step and said cross section state observing step each include the step of detecting said secondary electrons or said reflected electrons and displaying said detected secondary electrons or said detected reflected electrons on an observation CRT.

10. The cross section cutting and observing method according to claim 6, wherein said cross section cutting process observing step includes the step of stopping the scanning with said ion beam when a required cross section is obtained.

11. A method of cutting a cross-section of a semiconductor wafer, comprising the steps of:

scanning an ion beam on a predetermined area of said wafer for cutting a cross section therein;

simultaneously therewith, scanning an electron beam on said cross section being cut and detecting electrons reflected from said semiconductor wafer; and based upon said reflected electrons detected during the preceding step, providing an indication of said cross-section being cut.

12. The method according to claim 11, wherein said step of scanning an ion beam includes directing said ion beam in a direction approximately vertical to a main surface of said semiconductor wafer.

13. The method according to claim 11, wherein said step of scanning an electron beam includes directing said electron beam in a direction that is displaced by a predetermined angle from a direction normal a main surface of said semiconductor wafer.

14. The method according to claim 11, wherein said step of scanning an ion beam includes directing said ion beam in a direction approximately normal to a main surface of said semiconductor wafer and said step of scanning an electron beam includes directing said electron beam in a direction that is displaced by a predetermined angle from said direction approximately normal to said main surface of said semiconductor wafer.

15. The method according to claim 13, wherein said predetermined angle is approximately 60°.

16. The method according to claim 14, wherein said predetermined angle is approximately 60°.

* * * * *